(12) United States Patent
Rytka et al.

(10) Patent No.: US 7,646,606 B2
(45) Date of Patent: Jan. 12, 2010

(54) IGBT PACKAGING AND COOLING USING PCM AND LIQUID

(75) Inventors: Maria Magdalena Rytka, Mississauga (CA); Vahe Gharakhanian, Oakville (CA); Rauf Jangirov, Toronto (CA)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/120,152

(22) Filed: May 13, 2008

(65) Prior Publication Data

US 2009/0284923 A1 Nov. 19, 2009

(51) Int. Cl.
*H05K 7/20* (2006.01)

(52) U.S. Cl. .................. 361/704; 361/690; 361/700; 361/715; 165/80.3; 165/104.33

(58) Field of Classification Search .............. 361/690, 361/695, 697, 700, 704, 715, 719; 165/80.3, 165/80.4, 104.33
See application file for complete search history.

(56) References Cited

U.S. PATENT DOCUMENTS

| | | | |
|---|---|---|---|
| 5,455,458 A * | 10/1995 | Quon et al. ................ | 257/714 |
| 6,239,502 B1 * | 5/2001 | Grewe et al. ............... | 290/1 B |
| 6,313,991 B1 | 11/2001 | Nagashima et al. | |
| 6,397,618 B1 * | 6/2002 | Chu et al. ................... | 62/259.2 |
| 6,549,407 B1 * | 4/2003 | Sauciuc et al. .............. | 361/699 |
| 6,628,521 B2 * | 9/2003 | Gustine et al. .............. | 361/704 |
| 6,943,293 B1 | 9/2005 | Jeter et al. | |
| 7,027,303 B2 * | 4/2006 | Apfelbacher et al. ........ | 361/704 |
| 7,180,745 B2 * | 2/2007 | Mandel et al. .............. | 361/719 |
| 7,200,007 B2 * | 4/2007 | Yasui et al. ................. | 361/716 |
| 7,246,940 B2 * | 7/2007 | Storm et al. ................ | 374/136 |
| 7,301,755 B2 * | 11/2007 | Rodriguez et al. .......... | 361/676 |
| 7,508,668 B2 * | 3/2009 | Harada et al. ............... | 361/699 |
| 7,538,422 B2 * | 5/2009 | Dangelo et al. ............. | 257/706 |

\* cited by examiner

*Primary Examiner*—Boris L Chervinsky
(74) *Attorney, Agent, or Firm*—Oral Caglar, Esq.

(57) ABSTRACT

A power control system may use power semiconductor devices such as insulated gate bipolar transistors (IGBT's) in a switching unit to provide motor control. The IGBT's may be cooled with a system that is configured and sized to provide proper cooling at steady-state operating conditions of the switching unit. The IGBT's may be placed in thermal communication with a compartment that may contain phase change material (PCM). When and if the switching unit is operated under transient high load conditions, excess heat may be absorbed by melting of the PCM. When steady state operating conditions are restored the PCM may solidify and release its latent heat to a coolant. The PCM may thus act as a thermal buffer for the cooling system and thus may provide that the cooling system may be minimally sized.

11 Claims, 6 Drawing Sheets

IGBT PACKAGING AND COOLING USING PCM AND LIQUID

BACKGROUND OF THE INVENTION

The present invention relates generally to power semiconductor devices and, more particularly, to providing cooling for such devices.

Power semiconductor devices, such as insulated gate bipolar transistors (IGBT's), are used in a variety of applications that require high frequency switching of electrical power. These applications may include motor controllers or power converters. In many of these applications, heat may be generated in the device. It may become necessary to remove this generated heat from the device.

Typically, heat may be removed from the device with a heat sink. Heat sinks may be constructed from heat conductive material which may absorb heat for the device and then transfer the heat to a surrounding environment. For example, a heat sink may comprise a metal plate with cooling fins which allow heat to be dissipated by convection into air. In a more complex example, a heat sinking arrangement may comprise a heat conductor and a fluid flow system for extracting heat from the device. Fluid-flow cooling systems may comprise closed channels through which a cooling liquid may pass.

Prior-art heat cooling systems are typically designed with a cooling capacity that may accommodate a worst-case operating condition for the device. For example, if an assembly of IGBT's were to generate 100 watts during a brief peak operation, a cooling system may be provided to convey away at least 100 watts from the assembly. This illustrative peak cooling capacity may be incorporated into a design of a motor controller or power converter, even if steady-state operation produces only a fraction of the peak heating. Such a design principle may not be problematic in ground-based applications of IGBT's. But when IGBT's are employed in aerospace applications, space and weight become paramount design considerations.

In an aircraft or other aerospace vehicle, power converters and motor controllers may be subjected to widely varying operating conditions. Transient loads may greatly exceed steady-state loads. Prior-art cooling systems may be provided in anticipation of these high transient loads. Consequently, prior-art cooling systems may be space-consuming and may add undesirable weight to an aerospace vehicle.

As can be seen, there is a need to provide a small and lightweight cooling system for power semiconductor devices. In particular, there is a need to provide such a cooling system that may be only as large as a steady-state cooling system while also having capability for transient condition cooling.

SUMMARY OF THE INVENTION

In one aspect of the present invention a power control apparatus comprises a switching unit having phase change material (PCM) for cooling at least one power semiconductor device.

In another aspect of the present invention a switching unit comprises at least one insulated gate bipolar transistor (IGBT), at least one coolant passage, and at least one compartment containing PCM in thermal communication with the at least one cooling passage for cooling the at least one IGBT.

In still another aspect of the present invention a method for controlling electrical power comprises the steps of dissipating heat from IGBT's at a steady-state rate of heat production into a coolant, and dissipating heat from the IGBT into a PCM at a transient rate of heat production.

These and other features, aspects and advantages of the present invention will become better understood with reference to the following drawings, description and claims.

BRIEF DESCRIPTION OF THE DRAWINGS

FIG. 7-1 is a perspective view of a switching module in accordance with the invention;

FIG. 7-2 is a perspective view of another switching module in accordance with the invention;

FIG. 7-3 is a perspective view of still another switching module in accordance with the invention.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention may be useful in power converters and motor controllers which employ power semiconductor devices such as IGBT's. More particularly, the present invention may provide for cooling of IGBT's in these applications. The present invention may be particularly useful in aerospace vehicles such as aircraft which may produce widely varying load conditions on the IGBT's. In such vehicles, IGBT's may produce heat at a first rate when operating at a steady-state. In some transient modes of operation the IGBT's may produce heat at a second rate that is much higher than the steady-state rate.

In contrast to prior-art power control systems, which may provide cooling systems designed and sized for worst-case heating of IGBT's, the present invention may perform cooling with a system that is only as large as one needed for steady-state cooling. The present invention, unlike the prior art, may utilize a phase change material (PCM) to temporarily absorb transient heat loads during peak operating conditions of the IGBT's. The PCM may absorb transient heat quickly and then release the heat gradually into a cooling system that is adapted and sized for steady-state operation.

Figure 1:
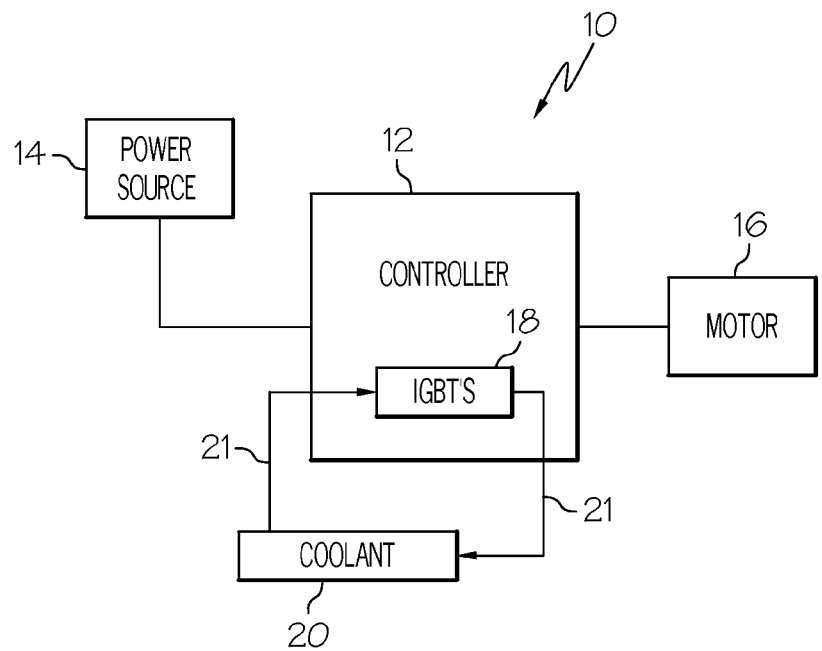
FIG. 1 is a block diagram of a power control system in accordance with the invention.

Referring now to FIG. 1, a power control system 10 may comprise a controller 12 and a power source 14. The controller 12 may provide controlled power to a motor 16. The controller 12 may comprise a switching unit 18 that may be comprised of one or more power semiconductor devices such as IGBT's. The switching unit 18 may be interconnected with a re-circulating reservoir 20 for a coolant 21.

Figure 2:
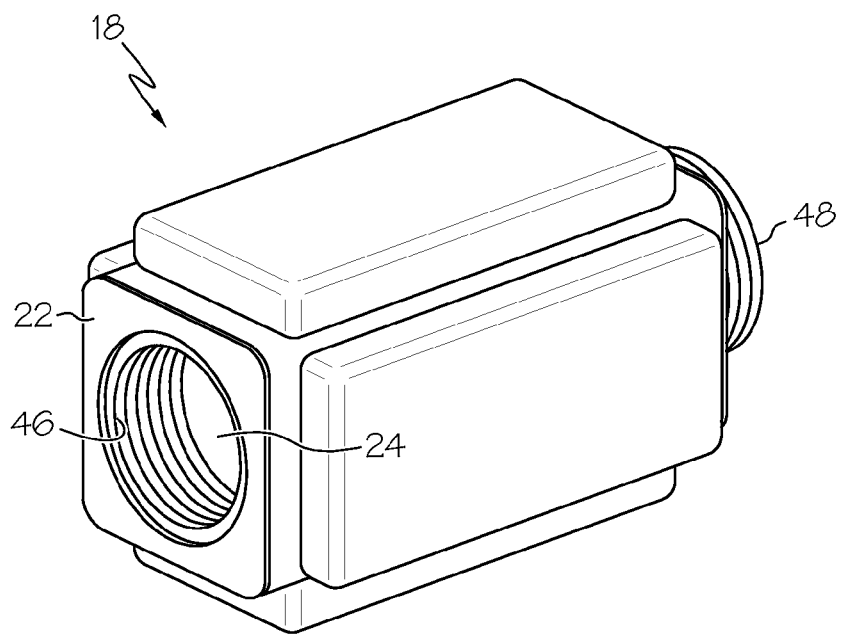
FIG. 2 is a perspective view of a switching unit in accordance with the invention.
Figure 3:
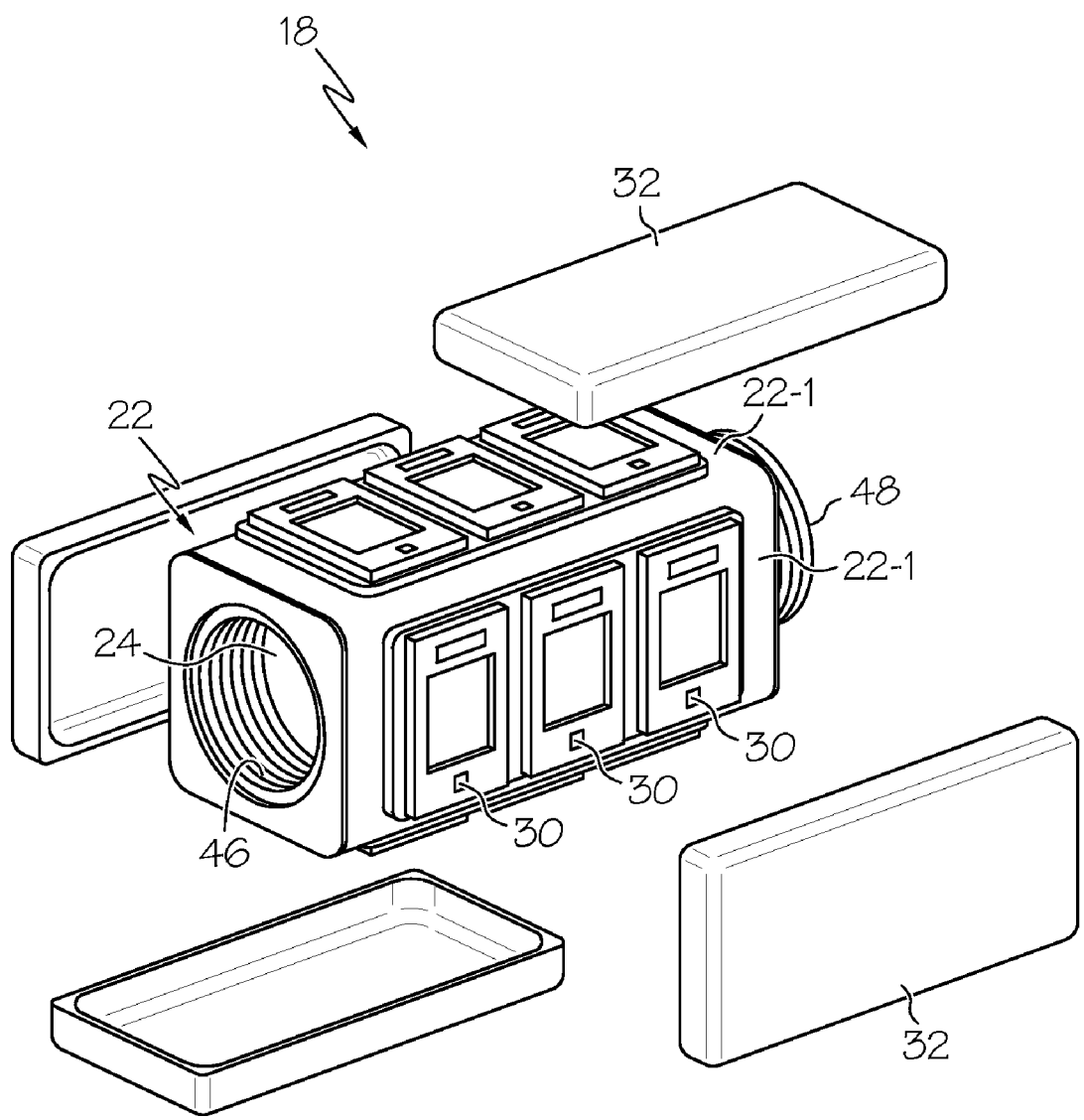
FIG. 3 is an exploded perspective view of the switching unit of FIG. 2 in accordance with the present invention.

Referring now to FIGS. 2 and 3, an illustrative embodiment of the switching unit 18 is shown. The switching unit 18 may comprise a body 22 with a cooling passage 24. The body 22 may comprise sides 22-1 on which power semiconductor devices such as IGBT's 30 may be assembled. Protective covering caps 32 maybe provided to cover to IGBT's 30.

In the embodiment of FIGS. 2 and 3, the body 22 may have four sides 22-1. One or more of the IGBT's 30 may be attached to each of the sides 22-1. The body 22 may be formed from a thermally conductive material which may provide a conductive path for heat produced by the IGBT's 30. Heat may be conducted into the passage 24. The passage 24 may accommodate recirculating flow of coolant from the coolant reservoir 20 of FIG. 1.

Figure 4:
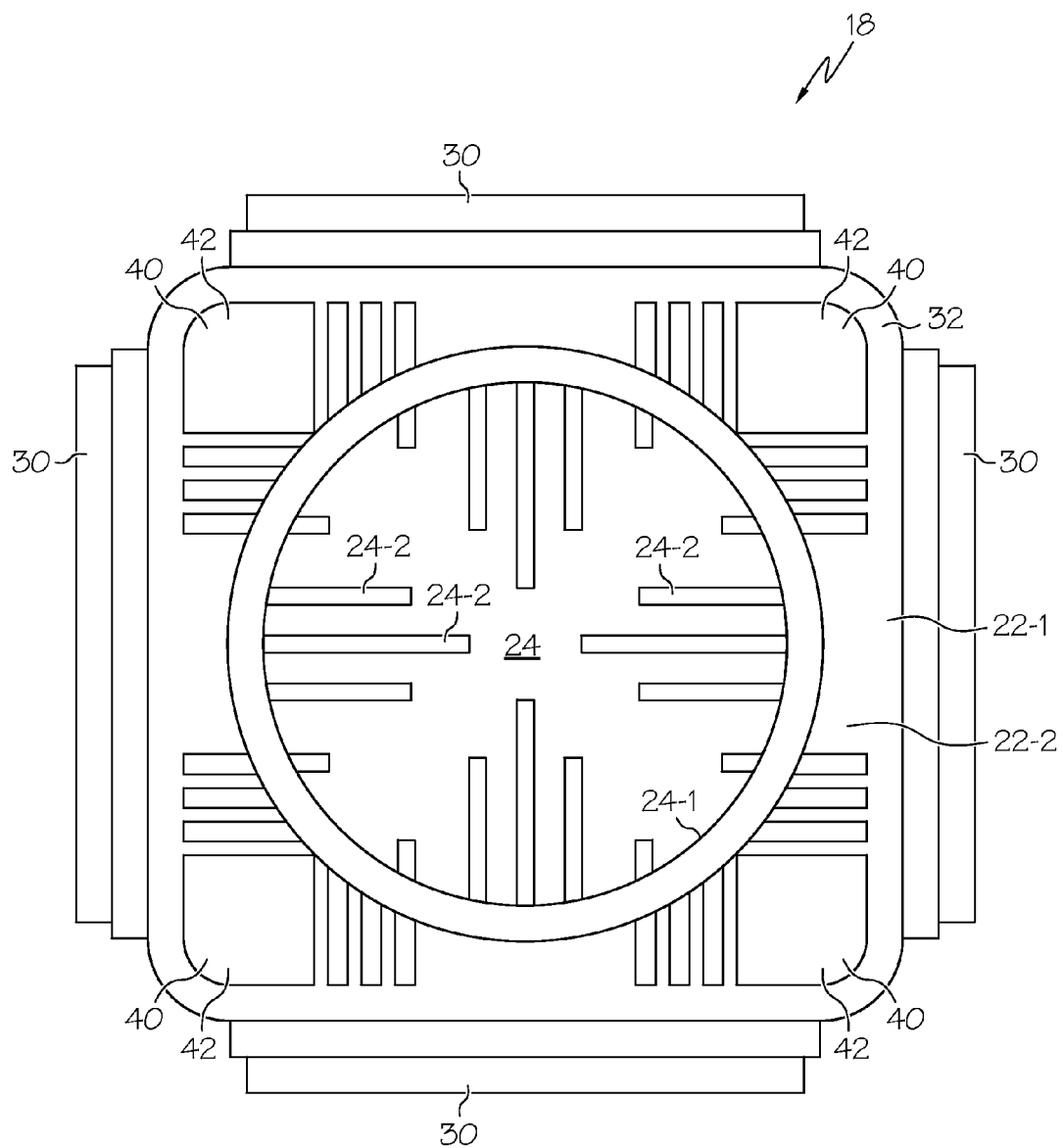
FIG. 4 is a cross-sectional view of the switching unit of FIGS. 2 and 3 in accordance with the invention.

Referring now to FIG. 4, a cross-sectional view of the switching unit 18 may show an illustrative configuration of the body 22. It may be seen that the passage 24 may be formed as a tube with a coolant retaining wall or tube wall 24-1. The passage 24 may also be provided with heat transfer fins 24-2 attached to the wall 24-1. Heat transfer members 22-2 may be interposed between the sides 22-1 of the body 22 and the tube wall 24-1. Consequently the sides 22-1 may be in thermal communication with the passage 24. It may be seen that compartments 40 may be provided inside the body 22. The compartment 40 may be thermally connected with the sides 22-1 of the body and the tube wall 24-1. However, the compartments 40 may be separated from the passage 24. In other words, material or fluid which may be in the compartments 40 may not co-mingle with material or fluid that may be in the passage 24. Nevertheless, the compartments 40 may be in thermal communication with the passage 24.

In the present invention, the compartments 40 may be filled with a phase change material (PCM) 42. In operation, the switching unit 18 may produce a steady-state amount of heat that may be conveyed away with the coolant 21 circulating through the passage 24. In the event of transient loading of the switching unit 18, the temperature of the switching unit 18 may rise to a temperature Tm above a steady-state temperature Ts. In that case, the PCM 42 may begin to melt, i.e., change phase. The PCM 42 may continue to melt and absorb its latent heat of fusion at the temperature Tm. When the transient loading condition ceases, the temperature of the switching unit may reduce to the temperature Ts and the PCM 42 may begin to solidify. In that case, the latent heat of fusion of the PCM 42 may be released into the circulating coolant 21.

In an illustrative embodiment of the present invention the switching unit 18 may comprise twelve of the IGBT's 30. Each of the IGBT's 30 may dissipate about 5 watts in steady-state operation. Thus, the illustrative switching unit 18 may produce heat at a steady state rate of about 60 watts. The switching unit 18 may be configured so that the coolant 21 may be re-circulated at a rate that absorbs about 60 watts to maintain a temperature Ts of about 100° C. The compartments 40 may be filled with a PCM that has a melting temperature Tm that is about 1° C. to about 5° C. above Ts. Methyle fumarate, for example, has a melting temperature of about 102° C. and, as such, this material may be suitable for use in one of the switching units 18 that may be designed to operate at a Ts of about 100° C. It may be seen that when transient loading of the switching unit 18 exceeds steady-state loading, heat dissipation may rise substantially above the steady-state level of about 60 watts. For example transient loading may produce heat at 100 watts. Temperature of the switching unit 18 may begin to rise above the temperature Ts. As the temperature rises to a temperature Tm of 102° C., the PCM 42 may begin to melt. As melting proceeds, the temperature Tm of 102° C. may be maintained in the switching unit 18.

After the switching 18 reverts to steady-state operation, heat transfer balance in the switching unit 18 may revert to steady-state conditions. In other words, heat may be produced at a rate of about 60 watts. The coolant 21 may carry away heat at this rate of 60 watts. Some of the latent heat of fusion of the PCM 42 may then transfer into the coolant 21. Consequently, the PCM 42 may begin to revert to its original phase. After all of the PCM 42 has returned to its original phase condition, the temperature of the switching unit 18 may again revert to about 100° C.

In general terms, the PCM 42 may be considered to function as a buffer. It may absorb excessive heat under high-load transient conditions and then may allow the absorbed heat to be dissipated when steady-state operating conditions are restored. To continue with the above example, it may be seen that the switching unit 18 may be only to be configured to accommodate about 60 watts of heat dissipation. This may be compared with prior-art systems which may be configured with a capability to continuously dissipate heat at the high loading rates associated with transient operating conditions. These transient operating conditions may cause heat dissipation to be three to five times as great as steady-state heat dissipation. Thus it may be seen that the present invention facilitates construction of switching units that may be three to five times smaller and lighter than prior-art switching units.

Figure 5:
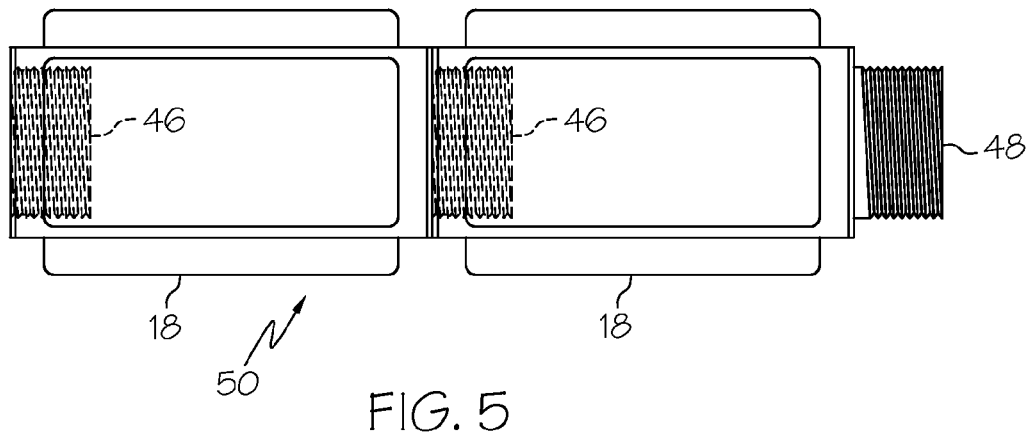
FIG. 5 is a longitudinal cross-sectional view of a switching module in accordance with the present invention.

Referring now to FIG. 5 and back to FIG. 2, it may be seen how the switching units 18 may be readily joined with one another. The switching unit 18 may be provided with a female threaded connector member 46 at one end and a male threaded connector member 48 at an opposite end. The member 48 may be threadably inserted into the member 46 to produce a switching module 50. The switching module 50 may comprise any number of the switching units 18 which may be connected in series or in parallel. The switching module may be constructed to meet various capacity requirements of the control system 10 of FIG. 1.

Figure 6:
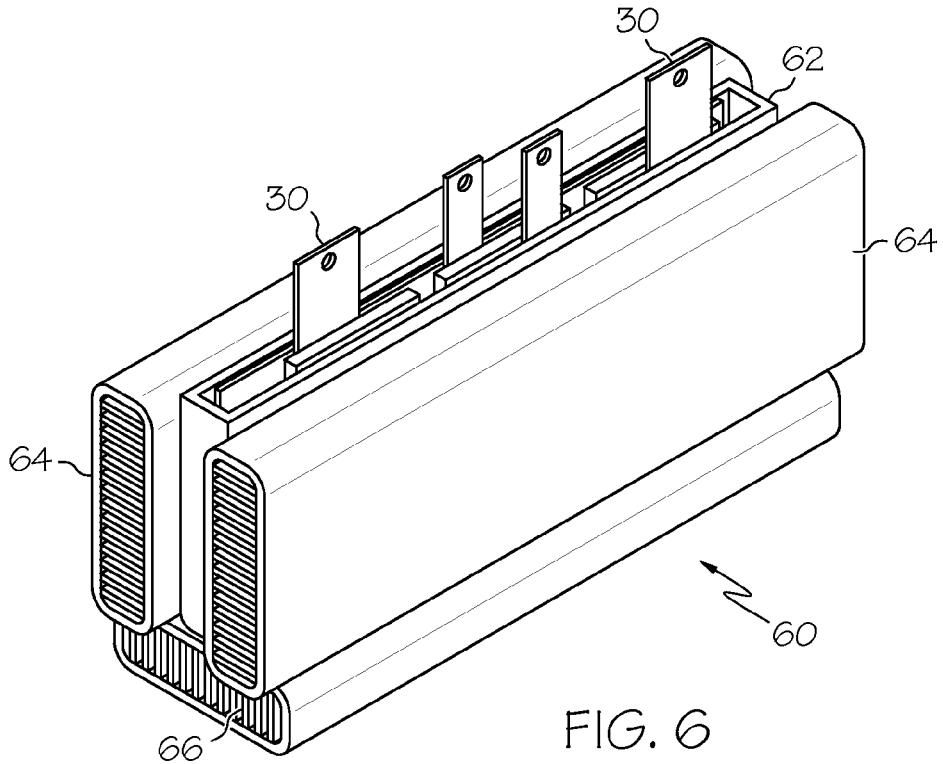
FIG. 6 is a perspective view of another embodiment of a switching unit in accordance with the invention.

Referring now to FIG. 6, a switching module 60 is shown in a planar configuration. The switching module 60 may comprises a mounting board 62 for the IGBT's 30. Coolant channels 64 may be positioned on opposite sides of the mounting board 62. In this regard, the switching module 60 may provided for cooling on two sides of the IGBT's 30. A PCM tank 66 may be positioned in contact with the coolant channels 64. As described above with respect to the switching unit 18 in FIG. 4, the PCM 42 may act as a heat absorbing buffer. The coolant channels 64 may be configured to accommodate steady-state heat dissipation. The PCM tank 66 may function to absorb increases of heat dissipation that may result from transient loading of the switching module 60.

Figures 1, 7:
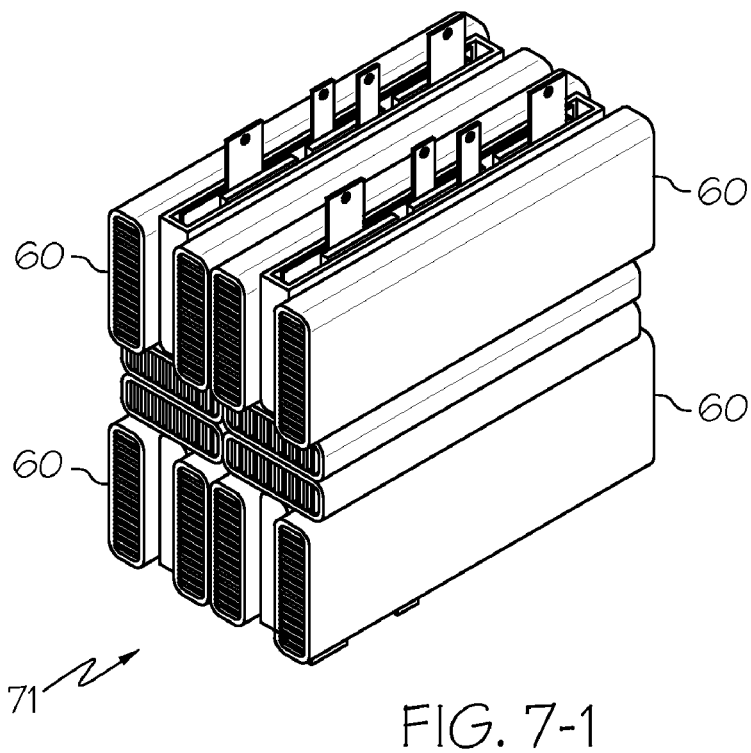
Figures 2, 7:
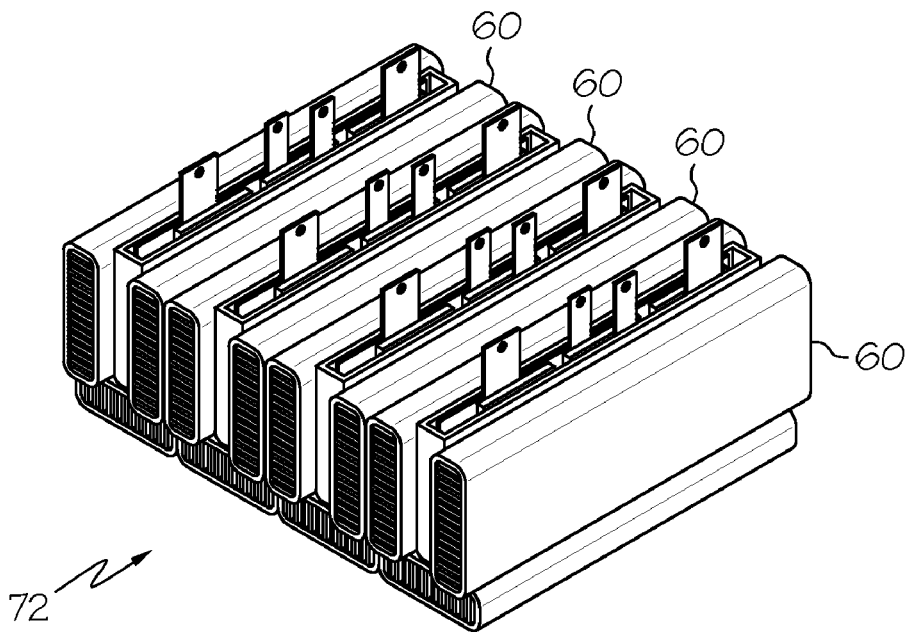
Figures 3, 7:
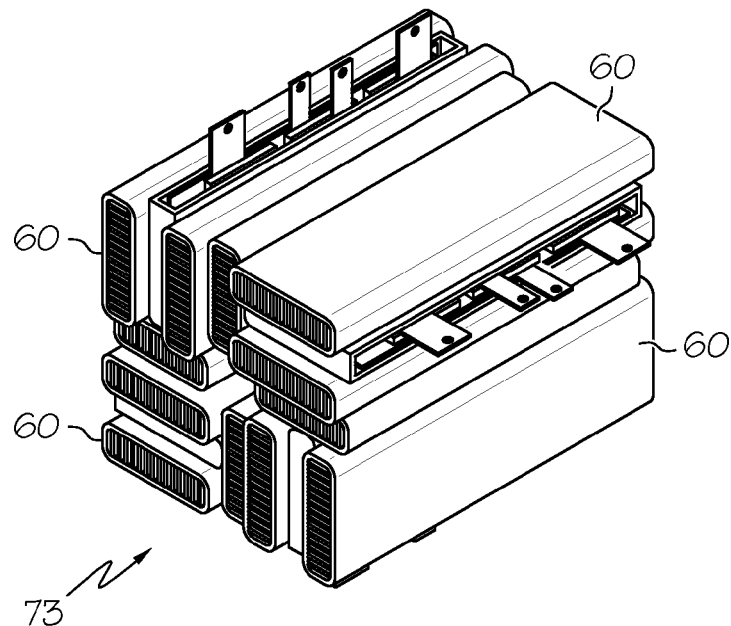

Referring now to FIGS. 7-1, 7-2 and 7-3 various switching modules are illustrated. As illustrated in FIG. 7-1, four of the switching units 60 may be configured to produce a vertically-stacked switching module 71. As illustrated in FIG. 7-2, four of the switching units 60 may be configured to produce a horizontally-stacked switching module 72. As illustrated in FIG. 7-3, four of the switching units 60 may be configured to produce a composite switching module 73.

Figure 8:
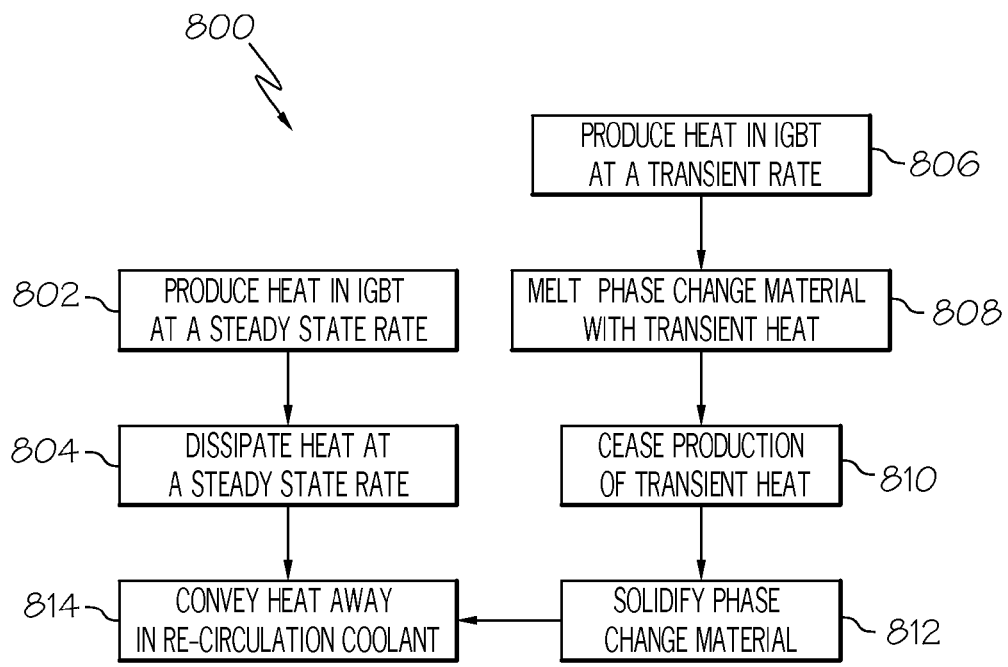
FIG. 8 is a flow chart of a method for controlling power in accordance with the invention.

In one embodiment of the present invention, a method is provided for controlling electrical power with semiconductor devices such as IGBT's. In that regard the method may be understood by referring to FIG. 8. In FIG. 8, a flow chart portrays various aspects of an inventive method 800. In a step 802, a heat may be produced in an IGBT at a steady-state rate (e.g., the control system 10 may place a steady-state load on the switching unit 18). In a step 804, the heat produced in step 802 may be dissipated (e.g., heat from the IGBT's 30 may be conducted into the coolant 21).

In a step 806, heat may be produced at a transient rate in the IGBT (e.g., the control system 10 may respond to high transient load on the motor 16 and the IGBT's 30 may produce heat at a rate greater than the steady-state rate). In a step 808, the transient heat may melt a phase change material (e.g., temperature of the switching unit 18 may rise to Tm and PCM 42 may begin melting to maintain temperature at Tm). In a step 810, transient production of heat of step 806 may end. In a step 812, the phase change material may solidify (e.g., the PCM 42 may solidify and release latent heat of fusion into the coolant 21). In a step 814, heat may be conveyed away in a re-circulating coolant (e.g., heat produced in either/or steps 802 and 806 or heat released in step 812 may be conveyed away in the coolant and through the reservoir 20).

It should be understood, of course, that the foregoing relates to exemplary embodiments of the invention and that modifications may be made without departing from the spirit and scope of the invention as set forth in the following claims.

We claim:

1. A power control apparatus comprising:
    a switching unit having phase change material (PCM) for cooling power semiconductor devices, the switching unit comprising;
        a thermally conductive body for supporting a plurality of power semiconductor devices;
        the body having;
            a cylindrical passage for coolant with threaded connectors at opposite ends thereof;
            four planar sides disposed around the cylindrical passage;
            at least one of the power semiconductor devices in thermally conductive contact with each of the four planar sides;
            four PCM compartments disposed around the cylindrical passage; and
            wherein each of the PCM compartments is in thermally conductive contact with the cylindrical passage and at least one of the planar sides.

2. The apparatus of claim 1 wherein the PCM has a phase change temperature Tm which is no greater than five degrees centigrade above a steady-state operating temperature Ts of the switching unit.

3. The apparatus of claim 1 wherein the PCM comprises methyle fumarate.

4. The apparatus of claim 1 wherein further comprising:
    at least two of the switching units threadably connected together.

5. A switching module comprising:
    at least one switching unit comprising;
        a plurality of insulated gate bipolar transistors (IGBT's);
        the IGBT's having first and second planar sides;
        a first coolant passage in thermally conductive contact with the first planar sides of the IGBT's;
        a second coolant passage in thermally conductive contact with the second planar sides of the IGBT's; and
        at least one compartment containing PCM and in thermal communication with the first and second coolant passages for cooling the IGBT's.

6. The switching module of claim 5 comprising at least four of the switching units in a vertically stacked configuration.

7. The switching module of claim 5 comprising at least four of the switching units in a horizontally stacked configuration.

8. A method for controlling electrical power comprising the steps of:
    dissipating heat from IGBT's from first and second planar sides of the IGBT's into first and second coolant passages; and
    maintaining a temperature rise of coolant below a predetermined limit during transient heat production by transferring heat from the first and second coolant passages to a PCM tank to change phase of PCM in the tank.

9. The method of claim 8 further comprising the step of transferring heat from the PCM to the coolant when transient heat production ends and the PCM solidifies.

10. The method of claim 8 wherein the step of dissipating heat into the PCM is performed after a temperature rise of no more than five degrees centigrade.

11. The method of claim 8 comprising the further step of re-circulating the coolant.

* * * * *